United States Patent
Bristol et al.

(10) Patent No.: US 6,193,812 B1
(45) Date of Patent: Feb. 27, 2001

(54) FLUX SOLUTION FOR SOLDERING CONTAINING BORNEOL

(75) Inventors: Samuel Victor Bristol, Kokomo; Mary Beth Young, Atlanta; David Ross Summers, Kokomo, all of IN (US)

(73) Assignee: Delco Electronics Corporation, Kokomo, IN (US)

( * ) Notice: Under 35 U.S.C. 154(b), the term of this patent shall be extended for 0 days.

(21) Appl. No.: 09/435,687

(22) Filed: Nov. 8, 1999

Related U.S. Application Data

(62) Division of application No. 08/880,848, filed on Jun. 23, 1997, now Pat. No. 6,010,577.

(51) Int. Cl.⁷ .................................................. B23K 35/36
(52) U.S. Cl. ................................................. 148/23; 148/25
(58) Field of Search ........................................ 148/23, 25

(56) References Cited

U.S. PATENT DOCUMENTS

| 5,004,508 | 4/1991 | Mace et al. | 148/22 |
| 5,004,509 | 4/1991 | Bristol | 148/23 |
| 5,127,968 | 7/1992 | Gomi et al. | 148/23 |
| 5,507,882 | 4/1996 | Bristol et al. | 148/23 |
| 5,747,217 | 5/1998 | Zakilka et al. | 430/158 |
| 5,907,007 * | 5/1999 | Ito et al. | 524/239 |

OTHER PUBLICATIONS

M.I. Pehgelly et al "An Investigation Into The Composition of Solder Fume," *Ann. Occup. Hyg.*, Mar. 8, 1994, vol. 38, No. 5, pp. 753–763.

* cited by examiner

*Primary Examiner*—Melvyn Andrews
(74) *Attorney, Agent, or Firm*—Jimmy L. Funke

(57) ABSTRACT

A soldering flux containing borneol, which is also referred to as bornyl alcohol. A method soldering using such a flux is also disclosed. Even minor proportions of borneol in the flux help reduce ionic residue from the flux after soldering. Larger proportions of borneol can give the flux tackiness for wave soldering operations. The flux preferably comprises borneol and an organic acid activator that volatilizes during soldering. The flux is applied as a solution of borneol and the organic acid activator in a solvent that substantially evaporates before soldering without leaving any measurable solvent residue.

8 Claims, No Drawings

FLUX SOLUTION FOR SOLDERING CONTAINING BORNEOL

This is a division of application Ser. No. 08/880848 filed on Jun. 23, 1997 now U.S. Pat. No. 6,010,577.

BACKGROUND OF INVENTION

1. Field of the Invention

This invention relates to a soldering flux adaptable to several different types of electronic soldering applications, including microelectronic applications. More particularly, the flux of this invention contains borneol, an agent that acts to reduce residues and/or increase allowable activator concentration, and to impart tackiness to the flux when used in larger proportions. The soldering applications include the soldering of microelectronic chip components to metal films on composite material circuit boards and to cermet conductor films on ceramic substrates, and the reflowing of solder on contact bumps of semiconductor wafers.

2. Description of the Prior Art

Commercially used fluxes are often tailored in composition for given soldering applications, depending on the needs of those particular applications. For example, active and passive microelectronic chip components are wave soldered to a metal pattern on a composite circuit board. Such chip components can be resistors, capacitors, and integrated circuits. By composite circuit board, we mean a paper-reinforced epoxy or phenolic supporting substrate material having a foil and/or plated metal, usually copper, pattern thereon. In wave soldering chip components to such circuit boards, the chip components are usually temporarily bonded to the metal pattern side of the circuit board with a small amount of binder. The circuit board is then inverted for wave soldering, so that the metal pattern and the chip components are then disposed on the underside of the board. Typically, flux is applied to the underside of the board by horizontally moving the circuit board over a standing wave, or a spray, of flux. Next, the fluxed board is horizontally moved over a standing wave of molten solder. The flux preferably wets all surfaces it contacts, including the chip binder as well as conductor surfaces, to insure that the flux reaches all the parts of the chip electrodes and metal pattern where soldering is desired. If the flux has significant tackiness, it can help retain the chips affixed to the circuit board during the thermal shock and fluid flow of the solder wave. If the metal is relatively clean to start with, the oxide-cleaning requirements of the flux may not be particularly demanding. On the other hand, in many applications, flux residue, and its cleanability can be an important issue, as will hereinafter be discussed.

The soldering of active and passive microelectronic chip components to ceramic substrates have their own distinctive soldering issues to consider. Hybrid integrated circuit modules are made from such substrates. Microelectronic chip components are soldered to a cermet conductor pattern on the ceramic substrate, while the substrate is face up. The demand for tackiness in this application is significantly less. However, the oxide-cleaning demands are significantly higher. Hence, the flux may have to include a higher proportion of activator, which can lead to higher ionic residues from the flux after soldering. Moreover, in these applications wettability and cleanability are usually quite important. In addition, it is usually preferred that our flux leave little or no organic residue. Flux residue, if any, should be readily cleanable at the very least. However, it is most preferred that the flux leave little or no ionic or organic residue that has to be removed by cleaning.

Still another soldering application involves a semiconductor wafer having contact bumps thereon for each integrated circuit chip incorporated in the wafer. The wafer, such as of silicon, has a dielectric coating of silicon nitride or the like on its surface with a plurality of contact windows in the dielectric coating for each integrated circuit chip incorporated in the wafer. A contact bump is disposed in each window. Solder is deposited on each contact bump. The bump solder is melted at least once and preferably twice, to re-flow the solder to obtain a uniform bump height, geometry and appearance. The wafer is fluxed during such re-flow. In such an application, it is important that the flux used in this particular application have good wettability on the dielectric surface, good spinability for application to the dielectric surface, and have good cleanability. As to cleanability, it is much preferred if the flux leaves little or no ionic or organic residue after solder reflow, so that the wafer surface does not have to be cleaned at all.

In recent years, commercial interest in "no-clean" and low residue fluxes has significantly increased. The interest has moved from the simple desire to leave no visible residue to the unaided eye, to actually measuring the extent of ionic residue, even if it cannot be seen with the unaided eye. Initially, "no-clean" fluxes simply did not require post-soldering cleaning with environmentally unfriendly cleaners, as for example chlorofluorocarbon solvents or chlorinated solvents, which rosin-based fluxes normally required. However, such "no-clean" fluxes may or may not have left a residue that was visible or not to the unaided eye. However, if any residue was left, it could be readily removed by rinsing with water or some other environmentally friendly solvent. Most recently, cleanliness requirements have increased. A truly low residue flux, by current standards, leaves little or no measurable ionic or organic residue, even when no residue can be seen with the unaided eye. By way of example, truly low residue fluxes are described in each of U.S. Pat. No. 5,004,509 Bristol and U.S. Pat. No. 5,507,882 Bristol, Hanaway and Walls, and also described in the U.S. patent application Ser. No. 08/559,543, filed Jul. 11, 1995 in the names of S. V. Bristol, E. H. Hanaway, T. R. Mueller, and M. J. Barnaby. The teaching of theses prior patents and applications are incorporated herein by reference.

For soldering chip type components to circuit boards, it is also known that camphor provides enhanced tackiness benefits to fluxes during soldering. As indicated above, the tackiness helps retain the electronic chip components in place during soldering operations.

OBJECTS AND SUMMARY OF THE INVENTION

It is an object of this invention to provide improved soldering fluxes for electronic components.

It is another object of this invention to provide improved methods of soldering electronic components that include improved fluxing methods using our improved flux.

These and other objects of this invention are obtained with a flux containing borneol and an acid activator. In a preferred embodiment all components of the flux substantially volatilize and/or sublime during soldering, so that only a low ionic or organic residue is left, if any residue is left at all. Even when the borneol is used in relatively large proportions, it evaporates and/or sublimes substantially entirely during soldering, which leaves no visible residue. Borneol can thus be used to form a "no-clean" flux.

The activator, which ordinarily is one or more organic acids, preferably is one that substantially completely volatilizes during soldering. Use of such an activator with borneol can form more than just a "no-clean" flux. It can form a flux with ionic residue, whether the residue can be seen with the unaided eye or not. On the other hand, it is recognized that in some applications, low ionic residue may not be a requirement. If so, higher concentrations of activators and/or activators with higher fluxing activity, could be combined with borneol.

The weight ratio of borneol to activator can vary quite significantly, depending on the soldering application, and the residue requirements. For example for composite circuit board applications, the preferred borneol to activator weight ratio might be 25:1 or higher, if IC flip chips soldered to the circuit board are not to be underfilled with epoxy resin. If the IC chips are to be underfilled, a borneol to organic acid activator weight ratio of about 8:1 to 12:1 might be more desirable. For ceramic substrate soldering applications the preferred borneol to activator ratio might be 0.07:1. For solder bump re-flow applications the preferred borneol to activator ratio might be 0.25:1.

We prefer an activator that volatilizes and/or sublimes during soldering, like the borneol does. One activator that works especially well with borneol is the three acid mixture (TAM) described in each of U.S. Pat. No. 5,004,509 Bristol, U.S. Pat. No. 5,507,882 Bristol, Hanaway and Walls, and U.S. patent application Ser. No. 08/500,543 filed Jul. 11, 1995 in the names of Bristol, Hanaway, Mueller, and Barnaby. The TAM activator consists essentially of succinic acid, glutaric acid and adipic acid and substantially completely volatilizes at soldering temperatures.

To apply a borneol-containing flux composition to a surface for fluxing, the flux components are preferably dissolved in a solvent to form a flux solution. The solvent is ordinarily one that will evaporate without leaving an ionic residue, as for example alcohols, ethers, and hydrocarbons such as petroleum ethers. Depending on the particular fluxing application mentioned above, the preferred borneol concentration in such a flux solution might be as low as about 0.25% by weight, or as high as about 25% by weight. Analogously, depending on the application described above, the preferred activator concentration in such a flux solution might be as low as about 2% by weight, or as high as about 10% by weight.

One or more wetting agents and/or surfactants can also be included in the flux solution to enhance its wettability, spinability, and/or other properties of the flux solution or flux composition. We have found that if some of these agents are used in higher concentrations, they can also be used as activators that provide low ionic flux residue.

DETAILED DESCRIPTION OF THE PREFERRED EMBODIMENTS

As indicated above, this invention involves flux compositions containing borneol and an activator. For application to a surface, the flux composition is usually dissolved in a volatile solvent, to form a flux solution. The solvent evaporates after application to the surface, leaving a coating of the flux composition on the surface. The following discussion is first directed to the flux composition itself, i.e., the solids content in the flux solution, and to its borneol to activator ratios for various soldering applications.

As indicated, the borneol-containing flux compositions of this invention are specifically formulated for various soldering applications. The soldering applications include soldering microelectronic chip components to metal films on composite circuit boards, soldering microelectronic chip components to cermet films on ceramic substrates, and re-flowing solder on flip chip bumps of semiconductor wafers. In all applications, borneol can help reduce ionic content in flux residue, even when the borneol is used in small proportions. For composite circuit board soldering applications, larger proportions of borneol can be used. This imparts a tackiness to the flux composition after the flux solvent evaporates, making borneol especially useful as a "no-clean" flux for composite circuit board soldering applications. The tackiness characteristic can be useful even if low residue is not a requirement. On the other hand, an integrated circuit chip is sometimes given an epoxy underfill after being soldered to a circuit board. In such instances, a lesser proportion of borneol may be desirable in the flux. The reason for this is that higher proportions of borneol can leave surfaces that the epoxy resin does not readily wet and/or adhere to. If so, then lesser proportions of borneol should be used until satisfactory wetting and/or adherence is obtained, as for example about 5%–10% by weight, borneol in the flux solution. It is uncertain if the lesser wettability and/or adherence is due to residual organics from the borneol, or not. However, we presume that it is, even though we have not been able to detect a residue. For analogous reasons, we also prefer to use lower borneol concentrations in flux solutions used for wafer bump solder re-flow. Accordingly, by low residual organics, we mean that an epoxy underfill resin will wet and adhere to the facing surfaces of the soldered IC flip chip and the circuit board. The facing surface of the IC flip chip is the surface under the flip chip after it is soldered to the circuit board.

Borneol is an alcohol with the chemical formula $C_{10}H_{17}OH$. Borneol is an alcohol derivative of camphane, and has the chemical name 2-hydroxycamphane. Camphane, also bornane, is a bridged ring of 1-methyl cyclohexane, in which the bridge is a fully methylated carbon atom extending between positions 1 and 4 of the cyclohexane ring. Borneol is also identified as bornyl alcohol.

One important characteristic of borneol is that it substantially evaporates and/or sublimes during soldering. In hereinafter using the expression "volatilize" or "volatilization", we mean to include both evaporation and sublimation. Because borneol volatilizes substantially completely during soldering, it contributes little, if any, to ionic flux residue on the soldered part. Borneol, itself, therefore has a "no-clean" characteristic when used in a soldering flux. The reason for this is that borneol boils at 212° C., which is considerably below conventional commercial soldering temperatures. Thus, borneol will substantially completely volatilize while the parts being soldered are heated to soldering temperatures. This includes soldering of a composite circuit board, where the board and its chip components are heated by a molten solder wave or by re-flow soldering. Borneol will substantially completely volatilize when the board and chips are in contact with the molten solder, or shortly thereafter from latent heat in the soldered assembly. The result is that the borneol essentially vanishes from the soldered composite circuit board assembly, and leaves no measurable residue. Thus, borneol contributes nothing of significance to ionic flux residue that needs to be cleaned off the soldered surface. Hence, adding borneol to a flux does not necessitate any significant cleaning of the soldered product. Very importantly, adding borneol to a flux composition does not require that the circuit board be cleaned with an environmentally unfriendly cleaner. Accordingly, borneol does not require cleaning by chlorofluorocarbon solvents, such as freon, or chlorinated hydrocarbon solvents such as trichloroethane, trichloroethylene, or the like. On the other hand, as indicated above, in some instances, such as epoxy underfill of IC flip chips, one may want to use a lesser proportion of borneol, to enhance wetting and/or adherence of the underfill.

From the foregoing, it can be seen that if borneol is combined with a "no-clean" flux activator, the borneol can form a "no-clean" flux. By "no clean", we mean that the activator, or the flux, does not leave any significant residue visible to the unaided eye, and if any residue is left at all, it can be removed without using environmentally unfriendly solvents or cleaners such as CFC-type or chlorinated organic solvents. Moreover, we have found that borneol can be used to form even cleaner fluxes. It can be used to form "low ionic residue" fluxes when combined with suitable activators. By "low ionic residue", we mean that a flux residue, whether visible to the unaided eye or not, has an ionic content, expressed as micrograms per square centimeter equivalent of NaCl (per Omega Meter measurement), that is very low, i.e., below about 5 $\mu g/cm^2$, and preferably below about 1.2 $\mu g/cm^2$.

It was mentioned above that borneol boils at about 212° C. For comparison, conventional soldering temperatures are about 250–260° C., but could be up to 350° C., and even up to about 450° C. for some special soldering applications. In some applications, circuit board components may be soldered to the circuit board at the lower end of the temperature range, and other connections made at the higher end of the temperature range. Flip chip bumps may be reflowed at the low end of the range, or even lower, but higher than 212° C. A typical solder for microelectronic applications is a tin-lead solder. Examples are by weight, 60% tin and 40% lead (mp 191°–193° C.) or eutectic tin-lead solder of, by weight, 63% tin and 37% lead (mp 183° C.).

Borneol exhibits a second and a third characteristic that are important to this invention, in addition to the first characteristic of low boiling point described above. The second important characteristic is that borneol functions in some way to reduce ionic content in the flux residue. We believe that borneol reduces ionic content in the flux residue by forming esters with the activator and/or the activator residue. This can occur, of course, even when the residue cannot be seen with the unaided eye. A flux can thus become an even cleaner "no-clean" flux. Fluxes with low ionic residue are especially important in applications where the soldered surfaces cannot be cleaned well or at all, or where the soldered product is subjected to particularly corrosive conditions of operation. In the alternative, use of borneol in the flux can allow use of a higher proportion of activator while substantially maintaining a given level of ionic residue. In such instances, the flux can become more active from a fluxing standpoint without adversely deteriorating its "no-clean" or "low ionic residue" features. This can be an asset when soldering surfaces requiring more active fluxing, as for example cermet surfaces, re-flowing solder on flip chip bumps, and more oxidized copper metal surfaces. In some instances, even small amounts of borneol in the flux allows one to double or even triple the activator concentration in a flux solution, without significantly increasing ionic residue. This effect is especially true for the three acid mixture (TAM) activator referred to above.

This second characteristic of borneol is important in the soldering of microelectronic chip components to ceramic substrates. In some instances, exceptionally low ionic residue may be required for the flux. In others, the cermet surfaces can require more active fluxing while maintaining low ionic residues. Inclusion of borneol in the flux can permit higher concentrations of activator in the flux solution without producing an objectionable increase in ionic residue. On the other hand, such substrates are normally wire bonded after soldering, and cleaning after soldering is not usually desirable. Too high a concentration of borneol in a flux solution can adversely affect the wire bond surfaces in such an application even if a residue is not detected. However, only a little proportion of borneol is needed to lower ionic residue, or to allow a greater activator proportion to be used. Accordingly, we would normally prefer that only a small proportion of borneol be used in the flux for such applications.

In view of the above, in soldering microelectronic chips to ceramic substrates, we would normally prefer that our flux composition have a weight ratio of borneol to activator from about 0.04:1 to 0.1:1. A flux solution of such a flux composition would have an activator concentration of about 2%–6% by weight, and still provide low ionic residue. For such a low activator concentration in the flux solution, we might prefer to use less than 1% by weight borneol, as for example about 0.1%–0.5% by weight. In our currently preferred flux solution for this application, we include wetting agents and other surfactants in the flux solution as well. They are mentioned here because in our preferred flux solution, we also use selected wetting agents and surfactants as activators. We can do this because we know they can function as activators when used in higher concentrations, and they can perform this function alone and in combination with other such agents and activators. We also know that selected ones of these can each be used in concentrations of about 0.5%–2.5% by weight, without producing a significant ionic residue. Accordingly, in our preferred fluxes, we include higher concentrations of certain wetting agents and surfactants along with the TAM to also serve an activator function, and yet still retain low ionic residue. In the flux example immediately below for this application, the borneol to total activator ratio is about 0.05:1, while the borneol to TAM activator ratio is about 0.07:1. An example of a flux solution for soldering chips onto ceramic substrates is as follows:

| Ceramic Substrate Flux | |
|---|---|
| Borneol | 0.25% by weight |
| Triacid Mixture (TAM) | 3.65% by weight |
| Hamposyl L | 0.9% by weight |
| Hamposyl M | 0.9% by weight |
| Monoethanolamine | <0.1% by weight |
| Isopropyl Alcohol | 94.3% by weight |

The first and second important characteristics of borneol are also important to re-flowing contact bumps on a silicon wafer, which is another soldering application referred to above. Contact bumps may be given two re-flows to obtain an acceptable appearance and uniform bump height, geometry and appearance. For this application, borneol serves the function of enhancing the attainment of low ionic residues while allowing higher loadings of activator in a flux solution. It also helps the flux have good wettability and spinability on the wafer surface. As mentioned above, we prefer to use a mixture of activators that works with the borneol to achieve the low ionic residue. The mixture includes a known activator, along with wetting agents and surfactants that can also serve as activators when used in higher concentrations. They are preferably used in the same concentration ranges as indicated above. For a bump solder re-flow application, the weight ratio of borneol to activator in our flux can vary from about 0.1:1 to 0.5:1. We would prefer it to be about 0.2:1 to 0.3:1. As indicated above, a solution of borneol and activator in isopropyl alcohol provides good wettability, spinability and cleanability in this latter application. If a rosin-based flux were used for this application, it might work from a fluxing standpoint but could leave a significant residue that required cleaning in environmentally unfriendly solvents. In addition, extensive cleaning of wafer surfaces is usually not desirable. In the flux example immediately below, the weight ratio of borneol to total activator is about 0.2:1, while the weight ratio of borneol to TAM activator is about 0.25:1. In this application, there may be residual organics on the surface of the wafer. If so, hydrogen peroxide can be included in the flux solution to clean them. If residual organics are not present on the wafer surface, no hydrogen peroxide need be included in the flux solution. Removal of organic residues is necessary as organic residues could have a deleterious effect on the wetting and/or adhesion characteristics of subsequent underfill applications or processes. To insure cleanliness of the wafer surface, we would normally prefer that the flux solution include at least about 5% by weight, of a 30 wt. % aqueous solution of hydrogen peroxide. In many instances, we prefer that the flux solution include about 10%–20% by weight, of the 30 wt. % aqueous solution of hydrogen peroxide, and perhaps even up to 25% by weight.

The activator concentration in flux solutions for this application can be higher, as for example about 8%–14% by weight. The borneol concentration is correspondingly higher than mentioned above for soldering ceramic substrates, such as about 1%–3% by weight. This helps maintain low ionic residue and "no-clean" characteristics. An example of a flux solution for re-flowing solder on flip chip bumps could be as follows:

| Wafer Re-Flow Flux | |
|---|---|
| Borneol | 2.5% by weight |
| Triacid Mixture (TAM) | 10.0% by weight |
| Hamposyl C | 1.0% by weight |
| Hamposyl O | 1.0% by weight |
| Hydrogen Peroxide (30%) | 20% by weight |
| Monoethanolamine | 0.5% by weight |
| Isopropyl Alcohol | 65% by weight |

A third important characteristic of borneol is that it can impart tackiness to a flux if the borneol is present in higher proportions, as compared to the activator proportion. This characteristic, along with its "no-clean" properties, makes borneol especially useful in soldering active and passive microelectronic chip components to a metal pattern on a composite circuit board. The metal film on such a composite circuit board frequently is of copper, or of a plurality of metal films that include copper or a copper alloy. However, the metal film could be of other metals. The chip components can occasionally fall from, or disorient on, the board during soldering, depending on whether one is performing wave soldering or reflow soldering. The result is a reject that must be fixed or discarded. Using a flux that has significant tackiness can reduce such rejects. Tackiness in the flux helps retain the chip components in place until molten solder can wet the pattern and the chip electrodes, whereupon solder surface tension holds the chips in place until the solder hardens.

U.S. Pat. No. 5,004,508 Mace et al. discloses that camphor can impart tackiness to a flux, and can provide a thermally dissipated flux. Camphor is a ketone, that is also identified as 2-ketocamphane. Borneol is an alcohol. Borneol has a higher boiling point (212° C.) than camphor, which boils at 204° C. Accordingly, borneol remains slightly longer on the surface of the part being soldered before it volatilizes. Our borneol-containing flux can thus flux better and slightly longer, and retain its tackiness slightly longer. It is also to be noted that borneol is an alcohol. As an alcohol, it can esterify organic acids, to reduce measurable ionic residue, or to allow use of increased activator concentration in a flux solution without correspondingly increasing the measurable amount of ionic residue.

For composite circuit board applications, the weight ratio of borneol to total activator in our flux composition can vary from about 2:1 to about 25:1, or even higher. We would prefer the borneol weight to be about 8 to 12 times the TAM activator weight in the flux. In general, we prefer to use flux solutions containing about 10%–25% by weight, borneol for composite circuit board applications. The TAM activator concentration in such a flux solution might only be about 1%–5% by weight, but the total activator concentration can be up to about 8%–10% by weight, as is later explained in this paragraph. Similar to fluxes for the foregoing soldering applications, we prefer to include wetting agents and other surfactants in solutions of our flux, along with a known activator and borneol. As mentioned above, certain wetting agents and surfactants can also serve an activator function and produce a low ionic residue, if used in higher concentrations along with the TAM. As mentioned, TAM is a mixture of three dibasic organic acids. One example of a flux for composite circuit board applications is as follows:

| Composite Circuit Board Flux | |
|---|---|
| Borneol | 20% by weight |
| Triacid Mixture (TAM) | 2.0% by weight |
| Hamposyl L | 2.4% by weight |
| Hamposyl M | 2.4% by weight |
| Hamposyl S | 1.2% by weight |
| Isopropyl Alcohol | 72% by weight |

Reference is now made to activators that can be used in a flux of our invention. In some composite circuit board or ceramic substrate applications, flux ionic residue is not of special concern. In such applications, any one of many known activators could be used, usually one or more organic acids. However, in most applications, "no-clean" and low ionic residue are desired. In such instances, an activator should be selected that leaves little or no ionic residue. Many prior patents describe activators as leaving little or no residue, even though the activators they use appear to have boiling points higher than the soldering temperature. Popular activators are often one or more monocarboxcylic organic acids and/or dicarboxcylic organic acids. However care should be taken to use an organic acid activator that has a boiling point lower than the soldering temperature at which it is to be used. Otherwise, one runs the risk of having significant ionic residue on the soldered surface. We prefer to include a known mixture of three organic acids in our flux as a principle activator, to maintain low ionic residues. The three acid mixture (TAM) is used in the normal range of about 2%–5% by weight, in flux solutions for soldering chip components to a surface, and about 2–3 times that amount in flux solutions for wafer re-flow applications. The three acid mixture (TAM) is disclosed in each of U.S. Pat. No. 5,004,509 Bristol, U.S. Pat. No. 5,507,882 Bristol, Hanaway and Walls, and U.S. patent application Ser. No. 08/500,543 filed Jul. 11, 1995 in the names of Bristol, Hanaway, Mueller, and Barnaby. As indicated above, we prefer a "no-clean" flux.

The Three-acid mixture (TAM) consists essentially about 15%–30% by weight, succinic acid, 40%–63% by weight, glutaric acid and 10%–30% by weight, adipic acid. It preferably includes about 18%–30% succinic acid, 51%–61% glutaric acid and 11%–30% adipic acid. The percentages of succinic, glutaric and adipic acid are based on the total weight of the dibasic acid mixture. The TAM has a melting point (mp) of about 90°–130° C. and a boiling point (bp) of about 150°–210° C., especially 170°–195° C. It thus has a boiling point comparable to or less than borneol, and is capable of essentially completely volatilizing during heat soldering to leave the soldering site essentially free from ionic residue. The constituents of the TAM volatilize during the heat soldering operation, remain volatilized and do not recondense and/or redeposit at the soldering site as ionic residue. Thus, the TAM is an essentially non-recondensing and non-redepositing volatilizable dibasic acid mixture. A commercial mixture of the TAM is available from DuPont Canada, Inc. (DuPont Canada). It is also available from DuPont Co., Wilmington, Del. (DuPont) as DBA, and from BASF Corp., Parsippany, N.J.

In many instances; one may prefer to include a wetting agent and/or surfactant in the flux solution, as is frequently done with previously known other fluxes. The amount that is employed in the flux solution is enough to result in achieving the desired surface tension characteristics for wettability and/or spreadability of the flux solution, while not resulting in excessive foaming and/or in substantially increased ionic residue after soldering. Such agents are typically used in flux solution concentrations preferably below about 0.02% by weight, more preferably below about 0.01% by weight, and still most preferably about 0.003%–0.004% by weight. We consider such concentrations negligible.

On the other hand, as indicated above, we have found selected wetting agents, antistatic agents, surfactants and the like can also serve as activators in combination with the TAM activator. However, when used in moderate concentration, none of them provides a significant contribution to ionic residue. This allows one to use them together and with the TAM, along with borneol, resulting in the use of a higher total activator concentration but without the penalty of correspondingly higher ionic residue. Examples of commercially available wetting agents and surfactants include those available under the trademark Cyastat®, which is manufactured by the American Cyanimid Company, P.O. Box 6885, Bridgewater N.J. 08807-6885. Specific examples include, without limitation, Cyastat® 609, Cyastat® SP, Cyastat® SN, and Cyastat® LS. Cyastat® 609 Antistatic Agent is also called N, N-bis (2-hydroxyethyl)-N- 3'-dodecyloxy-2'-hydroxypropyl) methylammonium methosulfate. Cyastat® SP Antistatic Agent is also called stearamidopropyldimethyl-beta-hydroxyethylammonium dihydrogen phosphate. Cyastat® SN Antistatic Agent is also called stearamidopropyldimethyl-beta-hydroxyethylammonium nitrate. Cyastat® LS Antistatic Agent is also called (3-lauramidopropyl) trimethylammonium methylsulfate. There are preferred wetting agents that can concurrently serve a second function, which is as flux activator. Such wetting agents include the fatty acyl sarcosines, which are commercially marketed as Hamposyl® agents. Those Hamposyl® agents of particular interest are N-cocoyl sarcosine, N-lauroyl sarcosine, N-myristoyl sarcosine, N-oleoyl sarcosine, and N-stearoyl sarcosine. Such materials are commercially available as Hamposyl® surfactants from Hampshire Chemical Corporation, Lexington, Mass. 02173. Of course, other commercially available wetting agents may be advantageously employed in the soldering flux of the present invention, preferably if they are also antistatic agents too.

Reference is now made to solvents in which the flux composition can be dissolved to form a flux solution. As usual, to avoid bubbling or blistering during soldering, the solvent should be substantially evaporated from the flux composition by the time soldering occurs. For rapid manufacturing, the solvent should have high volatility, as for example lower molecular weight organic solvents, which are not only highly volatile but which inherently provide low residue upon evaporation. It should be recognized that the flux solvent should have a low evaporation residue, if low flux residue after soldering is desired. Borneol can be dissolved in low molecular weight alcohols, as for example methyl, ethyl and isopropyl alcohols, and ethers, which are inherently low residue solvents, preferably isopropyl alcohol. Borneol is also soluble in low residue and volatile hydrocarbons such as petroleum ethers, and the like. Other low residue solvents for borneol include benzene, toluene and acetone. Such solvents can also be used to dissolve most organic acid activators and flux solution additives.

It should also be mentioned that no particular heating is needed to vaporize the flux solvent. Accordingly, no special mention of heating has been made. On the other hand, we see no particular objection to warming the solution and/or the product being coated, so long as proper safety precautions are used. However, it is known that at the time of soldering, a flux solvent should be substantially completely evaporated. Otherwise one runs the risk that the remaining solvent will volatilize abruptly, causing bubbling, blistering, and/or solder balling during soldering, which is obviously objectionable.

The foregoing discussion discloses and describes several exemplary embodiments of the present invention. One skilled in the art will readily recognize from such discussion, and from the accompanying claims, that various changes, modifications and variations can be made therein without departing from the spirit and scope of the invention as defined in the following claims.

What is claimed:

1. A flux solution for the soldering of microelectronic electrical components, the flux solution consisting essentially of borneol, a volatile vehicle, and optionally one or more constituents chosen from the group consisting of activators, wetting agents and surfactants.

2. The flux solution of claim 1 wherein said borneol constitutes about 0.2%–25% by weight, of said flux solution.

3. The flux solution of claim 2 wherein the borneol constitutes about 10%–25% by weight, of said flux solution.

4. The flux solution of claim 3 wherein said flux solution also contains an organic acid activator that leaves a low ionic residue after soldering operations.

5. The flux solution of claim 4 wherein said organic activator constitutes about 1%–5% by weight, of said flux solution, and said organic acid activator consists essentially of a three acid mixture of adipic acid, glutaric acid and succinic acid that vaporizes at soldering temperatures.

6. The flux solution of claim 5 wherein said three acid mixture constitutes about 2%–4% by weight, of said flux solution and said solvent is at least one member selected from the group consisting of alcohols, petroleum solvents, ethers and ketones.

7. The flux solution of claim 1 herein said borneol constitutes about 0.1 to 0.5% by weight of said flux solution.

8. The flux solution of claim 1 wherein said flux solution consists of about 0.1% to 25% by weight of said borneol, said volatile vehicle, at least one organic acid activator, optionally at least one wetting agent, and optionally at least one surfactant.

* * * * *